Figure 1:
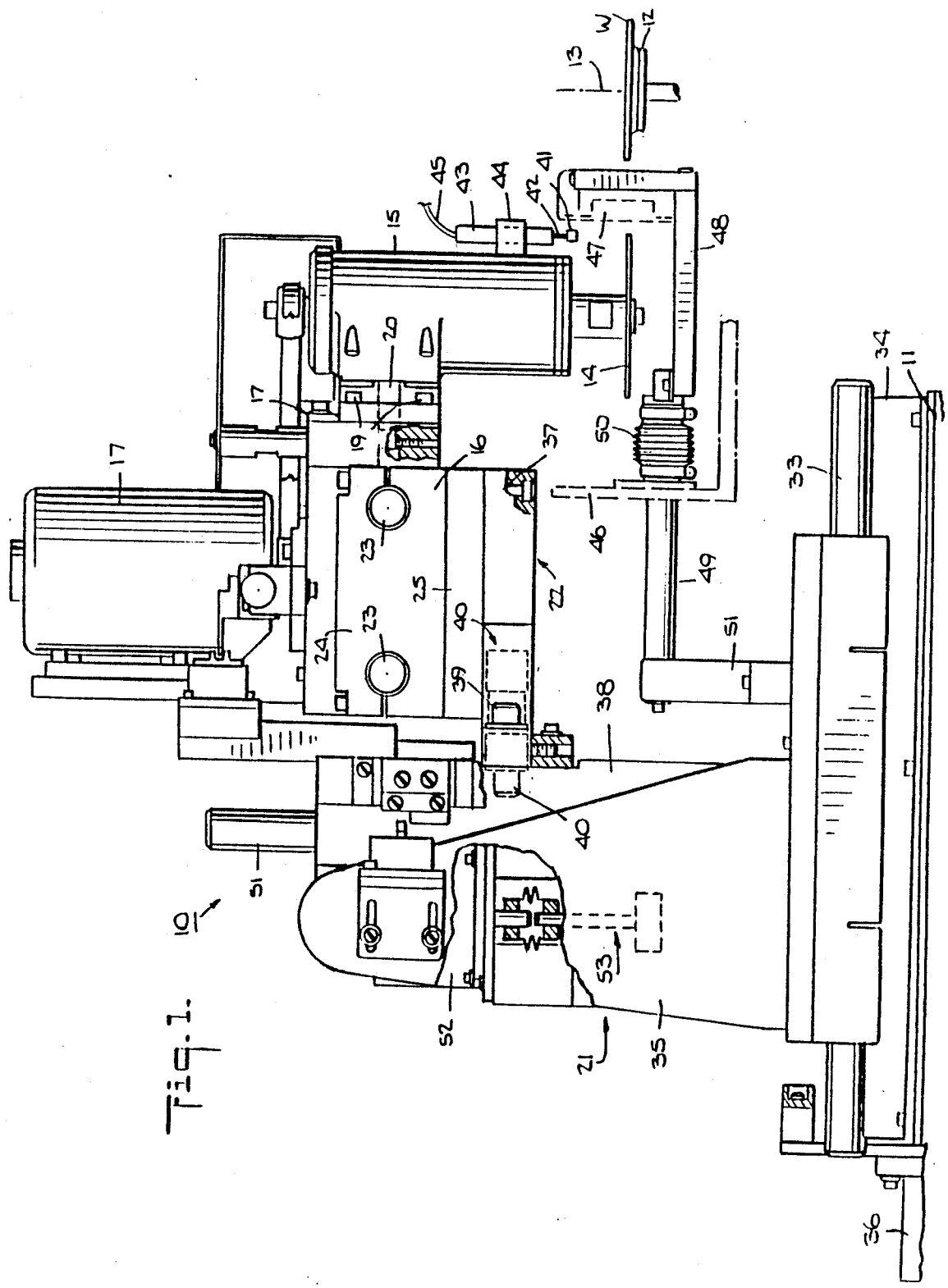

United States Patent [19]

Steere, Jr.

[11] Patent Number: 5,036,624
[45] Date of Patent: Aug. 6, 1991

[54] NOTCH GRINDER

[75] Inventor: Robert E. Steere, Jr., Boonton, N.J.

[73] Assignee: Silicon Technology Corporation, Oakland, N.J.

[21] Appl. No.: 369,111

[22] Filed: Jun. 21, 1989

[51] Int. Cl.⁵ .................... B24B 9/06; B24B 9/00; B24B 49/00

[52] U.S. Cl. ................ 51/106 R; 51/284 E; 51/34 C; 51/165.71

[58] Field of Search .......... 51/105 R, 105 LG, 106 R, 51/106 LG, 283 E, 98.5, 284 E, 34 C, 34 D, 34 E, 165.71, 165.8, 281 R; 125/30 R

[56] References Cited

U.S. PATENT DOCUMENTS

| | | | |
|---|---|---|---|
| 4,031,667 | 6/1977 | Sehestedt | 51/105 R |
| 4,203,259 | 5/1980 | Haddock | 51/101 LG X |
| 4,528,780 | 7/1985 | Halberschmidt | 51/283 E X |
| 4,638,601 | 1/1987 | Steere et al. | 51/165.71 |
| 4,753,049 | 6/1988 | Mori | 51/131.3 |
| 4,760,672 | 8/1988 | Darcangelo | |
| 4,864,779 | 9/1989 | Ozaki | 51/283 E |
| 4,905,425 | 3/1990 | Sekigawa | 51/283 E X |

FOREIGN PATENT DOCUMENTS

| | | | |
|---|---|---|---|
| 3534425 | 8/1986 | Fed. Rep. of Germany | 51/283 E |
| 1324826 | 7/1987 | U.S.S.R. | 51/106 R |
| 2126008 | 3/1984 | United Kingdom | 125/30 R |

Primary Examiner—Frederick R. Schmidt
Assistant Examiner—Bruce P. Watson
Attorney, Agent, or Firm—Kenyon & Kenyon

[57] ABSTRACT

The grinder is provided with a grind burr which is programmed to form a notch in a peripheral edge of a wafer before or after grinding of the peripheral edge of the wafer. The grind burr is mounted on the housing of the grinding wheel to be moved in common therewith. The grind wheel housing can be moved vertically to bring the grind burr into alignment with the edge of the wafer.

11 Claims, 2 Drawing Sheets

NOTCH GRINDER

This invention relates to a notch grinder. More particularly, this invention relates to a grinding machine for wafers, such as silicon wafers.

As is known, various types of edge grinders have been provided for the grinding of peripheral edges of wafers, such as silicon wafers, used in the manufacture of semi-conductor chips. For example, U.S. Pat. No. 4,638,601 describes an edge grinder for grinding peripheral surfaces of a wafer so as to have a curved linear profile and a flat. Pending U.S. patent application Ser. No. 07/345,627, filed Apr. 28, 1989, also describes an automatic edge grinder capable of forming a flat on a peripheral edge of a wafer.

In some cases, the fabrication of a wafer for subsequent processing in the manufacture of semi-conductor chips requires the wafer to have a notch in the periphery for identification and locating purposes. In the past, the formation of the notch required a separate operation from the grinding of the peripheral edge of the wafer. However, this has entailed additional machinery, as well as attendant problems with transporting and indexing a wafer in order to form a notch in an appropriate manner.

Accordingly, it is an object of the invention to be able to form a notch in a periphery of wafer in simple economical manner.

It is another object of the invention to be able to form a notch in a wafer of accurate size.

It is another object of the invention to reduce the machinery required for the grinding of a wafer with a notch in the periphery.

Briefly, the invention provides a notch grinder which is comprised of a housing, a grind wheel rotatably mounted in the housing to rotate about a first axis to grind a peripheral edge of a wafer and a grind burr mounted on the housing to rotate about a second axis parallel to the first axis and disposed in a plane spaced from the grind wheel in order to grind a notch in the wafer.

The housing is mounted so as to be movable relative to a wafer in order to selectively align the grind burr with the wafer to permit grinding of a notch and the grind wheel with the wafer to permit grinding of the peripheral edge of the wafer.

Where the wafer is mounted on a rotatable chuck so as to be rotated about a vertical axis, the grind wheel and grind burr are mounted on parallel axes in a common plane with the axis of the wafer. In addition, a means is provided for moving the housing along a path perpendicular to the axis of the wafer in directions towards and away from the chuck in order to grind a peripheral edge on the wafer. Another means is also provided for moving the housing along the axis of the grind burr in order to align the burr with a peripheral edge of the wafer on the chuck in order to permit grinding of a notch in the wafer.

In use, the grind burr is first aligned with the peripheral edge of the wafer and the housing moved toward the wafer. The burr is then able to grind a semi-circular notch in the peripheral edge of the wafer while the wafer is held in a stationary position by the chuck. Thereafter, the housing is moved, for example vertically, so as to align the grind wheel with the wafer. The grind wheel is then brought into contact with the wafer and the chuck rotated so that the peripheral edge of the wafer is ground by the grind wheel in a conventional manner.

Alternatively, the edge of the wafer may be ground first and then the notch may be formed.

Figure 2:
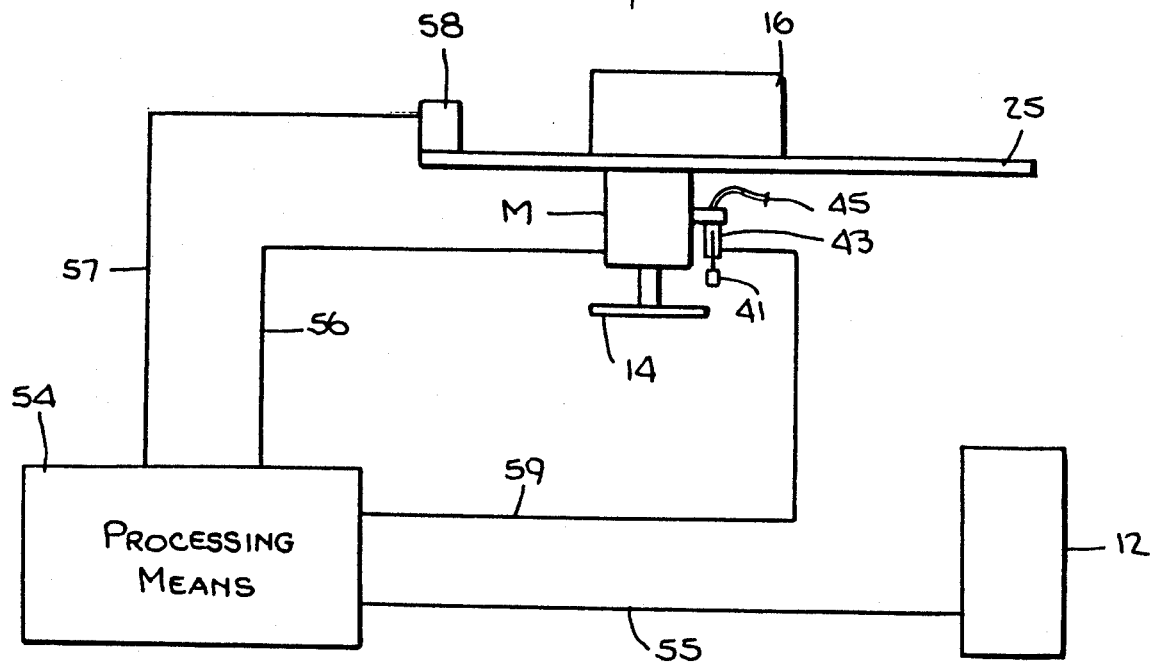
Figure 3:
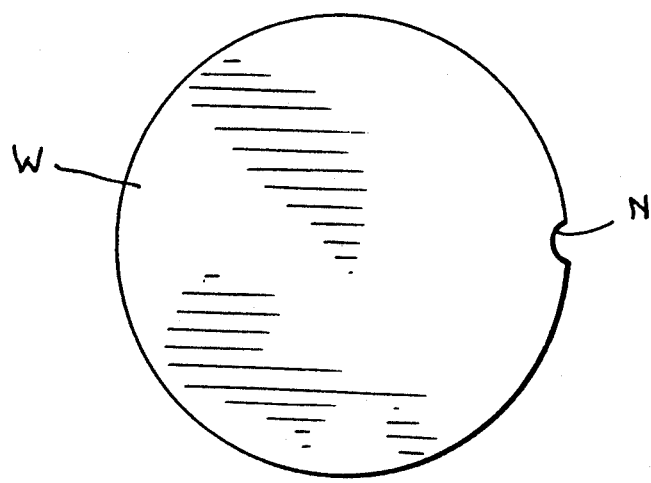

These and other objects and advantages of the invention will become more apparent from the following detailed description taken in conjunction with the accompanying drawings wherein:

FIG. 1 illustrates a side view of a grinding machine employing a notch grinder in accordance with the invention;

FIG. 2 schematically illustrates a circuit diagram of the connections between a processing means and the elements of the grinder in accordance with the invention; and FIG. 3 illustrates a wafer having a notch in a ground peripheral edge in accordance with the invention.

Referring to FIG. 1, the grinder 10 may be the form of a flat grind stage assembly, as described in co-pending patent application Ser. No. 07/345,627, filed Apr. 28, 1989. Thus, the common parts are not further described in detail herein.

As indicated in FIG. 1, the grinder 10 includes a holding means 12, such as a vacuum chuck, for holding and rotating a wafer W about a fixed central axis 13.

In addition, the grinder 10 has a grinding wheel 14 for grinding a peripheral edge of the wafer W. This grinding wheel 14 is rotatably mounted in a spindle housing 15 and driven by a motor M so as to rotate about a vertical axis parallel to the central axis 13 of the wafer W. The connection between the motor M and the spindle for the grinding wheel 14 is similar to that described in U.S. Pat. No. 4,638,601.

The spindle housing 15 is in turn secured to a carriage 16 as by bolts 19, for example, a pair of bolts 19 on each side of the housing 15. As indicated, the spindle housing 15 is also engaged with a pivot pin 20 for basic location and support. A registration bar 17 abutting the top edge of the spindle housing 15 serves to precisely align the spindle housing 15 to its original alignment during any subsequent removal and reinstallation. The registration bar 17 is installed only after the initial vertical alignment process is complete.

The grinder 10 includes a first means 21 for moving the carriage 16 and, thus the grinding wheel 14 along an axis or path perpendicular to the central axis 13 of the wafer W for grinding the edge of the wafer during rotation thereof as well as a second means 22 for moving the carriage 16 and, thus the grinding wheel 14 along a second axis or path perpendicular to the first path for grinding at least one flat on the edge of the wafer with the wafer in a stationary position.

Referring to FIG. 1, the means 22 for moving the carriage 16 to form a flat includes a pair of horizontally disposed parallel guide rails 23 for slidably guiding the carriage 16 thereon. The guide rails 23 are secured at opposite ends in brackets 24, each of which is secured to a horizontally disposed support plate 25. In addition, a stepper motor (not shown) is mounted on the plate 25 and is connected to the carriage 16 for moving the carriage 16 along the guide rails 23. To this end, the stepper motor is connected to a rotatable lead screw (not shown) which is journalled in a suitable bearing in one of the brackets 24 secured to the support plate 25. Thus, upon rotation of the screw, the carriage 16 is moved linearly along the length of the screw. A sensor 58 (see FIG. 2) is also provided for sensing the arrival of the carriage 17 in a predetermined fixed position that is, a "home" position, and emitting a responsive signal.

Referring to FIG. 1, the means 21 for moving the carriage 16 along a path towards and away from the central axis 13 of the wafer W is similar to that as described in U.S. Pat. No. 4,638,601. In this respect, the means 21 includes a pair of horizontally disposed parallel support rails 33 fixedly mounted on a frame 34 of the machine 11, a support housing 35 slidably mounted on the rails 33 and a stepper motor 36 connected with the support housing 35 for moving the housing 35 along the rails 33.

As indicated, the carriage 16 is secured via a levelling plate 37 to a bracket 38 of the support housing 35 by suitable bolts 39 and a pivot pin 40 for basic location and support.

Referring to FIG. 1, a grind burr 41 is mounted on the housing 15 in order to rotate about a vertical axis parallel to the axis 13 of the wafer W and is disposed in a horizontal plane vertically spaced from the plane of the grind wheel 14. The grind burr 41 is mounted on a shaft 42 which is rotatably mounted within a housing 43 secured by a bracket 44 in suitable manner to the spindle housing 15. The spindle 42 may be in the form of a high speed air spindle, which is driven by air conducted to the housing 43 by a suitable air line connection 45.

The axis 13 of the chuck 12, the axis of the grind wheel 14 and the axis of the grind burr 41 are disposed vertically and in a common plane, as indicated in FIG. 3. In addition, the grind burr 41 is of a diameter less than the diameter of the grind wheel 14. For example, the grind burr 41 has a diameter in the range of from 0.03 to 0.30 inches, while the grind wheel has a diameter in the range of from 1.00 to 10.00 inches. The vertical space in between the grind burr 41 and the grind wheel 14 may be, for example, 0.10 inches. This vertical dimension depends, in part, upon the thickness of a wafer W which is to be ground and may be adjusted from time to time using appropriate adjusting means.

Referring to FIG. 1, the grinding wheel 14 may be movably disposed within a housing 46 fixed to the frame of the machine 11. In addition, a seal assembly 47 is mounted on a yoke 48 which is also disposed within the housing 46 in fixed relation to the grinding wheel 14. The yoke 48 is, for example, mounted on a rod 49 which passes through a wall of the housing 46 and which is sealed thereto by means of a bellows 50. The rod 49 is mounted by suitable brackets 51 on the support housing 35 which is reciprocally mounted on the rails 33. The seal assembly 47 is constructed in a manner as described in co-pending application Ser. No. 07/343,064, filed Apr. 24, 1989. In this respect, the seal assembly is provided with a pair of sealing strips between which the wafer W projects for grinding by the wheel 14.

The machine 11 is also provided with a means for moving the spindle housing 15 vertically in order to align the grind burr 41 with a peripheral edge of a wafer W on the chuck 12 to permit grinding of a notch N (see FIG. 3) therein. For example, as indicated in FIG. 1, the bracket 38 is vertically movable along a pair of guide posts 51 (only one of which is shown) by means of a motor 52 and lead screw arrangement 53, for example, as described in U.S. Pat. No. 4,638,601.

Referring to FIG. 2, the grinding machine 10 is provided with a processing means 54 in the form of a computer or central controller which is connected to the various operating components of the machine 10 to control and coordinate the movements of the various components. To this end, the processing means 54 is connected via a suitable line 55 to the holding means 12 for holding and rotating a wafer during grinding. In addition, the processing means 54 is connected via a suitable line 56 to the motor M for the grinding wheel 14 in order to rotate the grinding wheel 14. The processing means 54 is also connected via a suitable line 57 to the sensor 58 in order to receive a signal therefrom that the carriage 16 has reached the home position. In addition, the processing means 54 is connected via a suitable line 59 to the spindle housing 43 in order to permit the delivery of air via the line 45 to permit driving of the spindle 42. In this respect, the spindle 42 and housing 43 are of conventional construction and operation.

The motor 52 is also connected to the programming means 54 so as to receive a signal in dependence upon the measured thickness of a wafer W. Depending upon the measured thickness, the motor 52 is actuated to raise the housing 15 and the associated grinding wheel 14 relative to the wafer W to be ground.

The processing means 52 is provided with a suitable program so as to produce a wafer with one or more notches N, one or more flats (not shown) and a curved linear periphery after grinding. To this end, the program for carrying out the grinding operation is initiated when a signal is received from the sensor 58 in cooperation with other relevant signals to proceed. In this respect, once a wafer W has been deposited onto the chuck 12, the processing means 54 activates the stepper motor for moving the carriage 15 to the home position. At this time, a signal from the sensor 58 is emitted to the processing means 54 to begin the grinding operation.

By way of example, in order to form a wafer W with a notch as shown in FIG. 3, the program for the grinding operation begins with the activation of the processing means 54. First, the processing means 54 delivers a signal to the motor 52 so as to lower the grind burr 41 into alignment with the wafer W. When this is obtained, a signal is directed to the motor 36 to move the support housing 35 towards the axis 13 of the wafer W so as to bring the grind burr 41 into grinding engagement with the periphery of the wafer W. During this time, the chuck 12 remains stationary so that the burr 41 is able to grind a semi-circular notch N in the edge of the wafer W.

Upon completion of the notch N, the support housing 35 may be backed away from the wafer W while the motor 52 is actuated by the processing means 54 in order to raise the housing 15 so as to bring the grind wheel 14 into alignment with the wafer W. The support housing 35 is then moved towards the periphery of the wafer W while the chuck 12 begins to rotate. In this way, coordinated actions of these movements permits the remainder of the peripheral edge to be ground, for example, to a circular shape.

In some cases, the notch N may be of other shapes, for example, a "V" shape having a 90° included angle which is semicircular at the bottom. The formation of this notch is accomplished by coordinating a rotary movement of the chuck 12 while the housing 35 moves the grind burr 41 into engagement with the wafer W. Correspondingly, any variety of notch configurations can be accommodated by using optional coordination of movements.

In the event that the wafer is also to be formed with a flat, a flat may be formed in accordance with the procedures described in co-pending patent application Ser. No. 345,627, filed Apr. 28, 1989. Alternatively, if no flat is to be formed, the grinder may be constructed in a manner as described in U.S. Pat. No. 4,638,601, with the grind burr 41 mounted on the housing for the grind wheel 14 without the interposition of a carriage means to permit movement of the grind wheel 14 to form a flat.

The processing means 54 may also be programmed so as to first form a peripheral edge on a wafer and to thereafter form a notch in the ground peripheral edge. The manner of doing so is self-evident and need not be further described.

The invention thus provides a relatively simple arrangement in a grinder to form a notch, as well as a peripheral edge, on a wafer in a common operation. Accordingly, the number of machines required to process a wafer is substantially reduced. In addition, the alignment and indexing procedures attendant with the formation of a notch in a wafer are substantially reduced.

What is claimed is:

1. A notch grinder comprising
   a rotatable chuck for holding and rotating a wafer about a first axis;
   a housing spaced from said chuck;
   a grind wheel rotatably mounted in said housing to rotate about a second axis parallel to said first axis;
   first means for moving said housing along a first path perpendicular to said first axis towards and away from said chuck to grind a peripheral edge of a wafer on said chuck;
   a grind burr mounted on said housing to rotate about a third axis parallel to said first axis, said burr being spaced from said grind wheel relative to said second axis; and
   second means for moving said housing along said second axis to align said burr with a peripheral edge of a wafer on said chuck to permit grinding of a notch therein.

2. A notch grinder as set forth in claim 1 which further comprises a high speed air spindle rotatably mounted on said third axis for rotating said grind burr.

3. A notch grinder as set forth in claim 1 wherein said third axis of said grind burr, said second axis of said grind wheel and said first axis of said chuck are vertically disposed in a common plane.

4. A notch grinder as set forth in claim 1 which further comprises a processing means connected to said chuck, said housing and said grind burr for holding said chuck in a stationary position on said first axis during rotation of said grind burr about said third axis.

5. A notch grinder as set forth in claim 1 which further comprises a processing means connected to said chuck, said housing and said grind burr for rotating said chuck on said first axis during rotation of said grind burr about said third axis during formation of a notch in the peripheral edge of a wafer on said chuck.

6. A notch grinder as set forth in claim 1 wherein said burr is of a diameter less than the diameter of said grind wheel.

7. A notch grinder as set forth in claim 6 wherein said burr has a diameter of from 0.03 to 0.30 inches.

8. A notch grinder comprising
   a housing;
   a grind wheel rotatably mounted in said housing to rotate about a first vertical axis to grind a peripheral edge of a wafer;
   a grind burr mounted on said housing to rotate about a second vertical axis parallel to said first axis and disposed in a horizontal plane vertically spaced from said grind wheel;
   first means for moving said housing vertically to selectively align said grind burr with a wafer to grind a notch in a peripheral edge of the wafer and to align said grind wheel with the wafer to grind the peripheral edge of the wafer; and
   second means for moving said housing horizontally relative to a wafer.

9. A notch grinder as set forth in claim 8 which further comprises a high speed air spindle on said second axis for rotating said grind burr.

10. A notch grinder as set forth in claim 8 wherein said burr is of a diameter less than the diameter of said grind wheel.

11. A notch grinder as set forth in claim 10 wherein said burr has a diameter of from 0.03 to 0.30 inches.

* * * * *

UNITED STATES PATENT AND TRADEMARK OFFICE
CERTIFICATE OF CORRECTION

PATENT NO. : 5,036,624
DATED : August 6, 1991
INVENTOR(S) : Robert E. Steere, Jr.

It is certified that error appears in the above-indentified patent and that said Letters Patent is hereby corrected as shown below:

Column 3, line 1, change "17" to --16--.

Signed and Sealed this

Seventeenth Day of August, 1993

Attest:

BRUCE LEHMAN

*Attesting Officer*     *Commissioner of Patents and Trademarks*